United States Patent
Kolagotla et al.

[11] Patent Number: 5,946,369
[45] Date of Patent: Aug. 31, 1999

[54] HIGH-SPEED BINARY SYNCHRONOUS COUNTER WITH PRECOMPUTATION OF CARRY-INDEPENDENT TERMS

[75] Inventors: Ravi Kumar Kolagotla, Breinigsville; Santosh K. Misra, Allentown; Jiancheng Mo, Allentown; Hosahalli R. Srinivas, Allentown, all of Pa.

[73] Assignee: Lucent Technologies Inc., Murray Hill, N.J.

[21] Appl. No.: 08/902,640

[22] Filed: Jul. 30, 1997

[51] Int. Cl.$^6$ ...................................................... H03K 21/16
[52] U.S. Cl. ............................ 377/115; 377/116; 377/119
[58] Field of Search ...................................... 377/115, 116, 377/119, 120, 127

[56] References Cited

U.S. PATENT DOCUMENTS

| | | | |
|---|---|---|---|
| 4,611,337 | 9/1986 | Evans | 377/116 |
| 4,759,043 | 7/1988 | Lewis | 377/116 |
| 5,381,453 | 1/1995 | Chan | 377/28 |
| 5,559,844 | 9/1996 | Lee | 377/116 |
| 5,754,615 | 5/1998 | Colavin | 377/116 |

*Primary Examiner*—Margaret R. Wambach

[57] ABSTRACT

An N-bit binary synchronous counter includes K counter stages, with each stage including N/K flip-flops or other suitable storage elements. A given one of the counter stages receives a carry-in signal generated by another counter stage or by a carry logic circuit. The given counter stage includes a selection circuit for selecting one of two precomputed values for application to an input of a storage element in that stage based on a value of the carry-in signal. The selection circuit may include a two-input multiplexer for each of the N/K storage elements of the given counter stage. The jth multiplexer includes a first input coupled to an output of the jth storage element, and a second input coupled to an output of a logic circuit. The logic circuit generates a logic function based on the output of the jth storage element and other lower significant storage elements in the stage. The carry-in signal is applied as a select signal to the multiplexer and is used to select which of the two multiplexer inputs will be applied as the data input of the storage element. This selection of one of two precomputed values for application to a storage element input results in the counter having a critical path delay which is substantially independent of N.

20 Claims, 4 Drawing Sheets

HIGH-SPEED BINARY SYNCHRONOUS COUNTER WITH PRECOMPUTATION OF CARRY-INDEPENDENT TERMS

FIELD OF THE INVENION

The present invention relates generally to electronic counter circuits and more particularly to binary synchronous counters for use in semiconductor integrated circuits and other electronic devices.

BACKGROUND OF THE INVENTION

Binary counters are fundamental components of microprocessors, memory circuits, digital signal processors, communications hardware and numerous other electronic devices. The ever-increasing demand for higher speed and bandwidth in such devices requires that counters operate faster and support a longer word length. A binary counter typically includes a number of interconnected flip-flops or other single-bit storage elements. The flip-flops are arranged to provide a number of parallel outputs each representing a bit of a binary number indicative of a count of clock cycles since a previous reset. The counter may be configured to increment or decrement a count by one with each clock cycle. In a type of binary counter known as a synchronous binary counter, a common clock signal is used to clock each of the flip-flops in the counter. Such an arrangement limits the maximum clock rate of the counter in that the clock period generally must be greater than the time required for a carry to propagate from an initial stage of the counter corresponding to the least significant bit (LSB) of the count to a final stage corresponding to the most significant bit (MSB). In a ripple-carry counter, a carry generated by an earlier counter stage is supplied to the next counter stage before the next stage can generate a carry. The carry propagation delay is therefore proportional to the number of stages in the counter.

FIG. 1 shows a portion of a conventional binary synchronous ripple-carry counter 10. The counter 10 is an N-bit counter divided into K stages each storing N/K bits. FIG. 1 includes a detailed view of a single exemplary stage $12_i$ of the N-bit counter with K stages, where N/K=4, and also illustrates interconnection of stage $12_i$ with a previous stage $12_{i-1}$ and a subsequent stage $12_{i+1}$ of the counter 10. The stage $12_i$ receives a carry-in signal $C_{IN}$ from the previous stage, $12_{i-1}$, and delivers a carry-out signal $C_{OUT}$ to the subsequent stage $12_{i+1}$. The stage $12_i$ includes four D-type flip-flops 14-0, 14-1, 14-2 and 14-3 arranged as shown. The uncomplemented outputs of the flip-flops 14-0, 14-1, 14-2 and 14-3 provide the $Q_0$, $Q_1$, $Q_2$ and $Q_3$ outputs, respectively, of counter stage $12_i$. Each of the flip-flops 14-0, 14-1, 14-2 and 14-3 is clocked by a common clock signal CLK. The $d_0$, $d_1$, $d_2$ and $d_3$ data inputs of the respective flip-flops 14-0, 14-1, 14-2 and 14-3 are driven by the outputs of corresponding respective two-input exclusive-or (XOR) gates 16-0, 16-1, 16-2 and 16-3. One of the inputs of each of the XOR gates is driven by the output of one of the flip-flops as shown. The carry-in signal $C_{IN}$ from previous gate $12_{i-1}$ is coupled to the other input of XOR gate 16-0 and to an input of AND gate 18-1. The remaining XOR gates 16-1, 16-2 and 16-3 each have their other input driven by the one of the outputs $c_1$, $c_2$ and $c_3$ of AND gates 18-1, 18-2 and 18-3, respectively, as shown. The $c_3$ output of AND gate 18-3 is connected to one input of an AND gate 20 which generates the carry-out signal $C_{OUT}$. The other input of AND gate 20 is connected to the $Q_3$ output of flip-flop 14-3.

The carry-in signal $C_{IN}$ received from counter stage $12_{i-1}$ is delayed with respect to the clock signal CLK due to gate delays in stage $12_{i-1}$ and other stages before it. If $C_{IN}$ is assumed to arrive in stage $12_i$ at time $t_{cin}$, the critical path delay $t_{Qcrit}$ for latching $Q_3$ in stage $12_i$ may be written as:

$$t_{Qcrit} = t_{cin} + 3 \cdot t_{and2} + t_{xor2} + t_{lset} \quad (1)$$

where $t_{and2}$ is the delay of a two-input AND gate, $t_{xor2}$ is the delay of a two-input XOR gate, and $t_{lset}$ is the latch settling delay of the D-type flip-flops. Similarly, the delay $t_{Ccrit}$ for the carry-out signal $C_{OUT}$ can be given by:

$$t_{Ccrit} = t_{cin} + 4 \cdot t_{and2} \quad (2)$$

Equations (1) and (2) above can be generalized to express the critical path delay of a given ripple-carry counter stage $12_i$ of N/K bits, as follows:

$$t_{Qcrit} = t_{cin} + \left(\frac{N}{K} - 1\right) \cdot t_{and2} + t_{xor2} + t_{lset} \quad (3)$$

$$t_{Ccrit} = t_{cin} + \left(\frac{N}{K}\right) \cdot t_{and2} \quad (4)$$

Using Equations (3) and (4), the total critical path delay $T_{crit}$ for an N-bit synchronous ripple-carry counter, with K stages of N/K bits each, may be written as:

$$T_{crit} = (K-2) \cdot t_{Ccrit} + t_{Qcrit} + t_{0crit} \quad (5)$$

where $t_{0crit}$ is the carry-out delay of the first counter stage. Since the first counter stage does not have any carry coming in, $t_{0crit}$ is simply the delay of ((N/K)−1) two-input AND gates:

$$t_{0crit} = \left(\frac{N}{K} - 1\right) \cdot t_{and2} \quad (6)$$

Using Equations (3), (4), (5) and (6), the critical path delay $T_{crit}$ may be written as:

$$T_{crit} = (K-2) \cdot \frac{N}{K} \cdot t_{and2} + 2 \cdot \left(\frac{N}{K} - 1\right) \cdot t_{and2} + t_{xor2} + t_{lset} \quad (7)$$

or $$T_{crit} = (N-2) \cdot t_{and2} + t_{xor2} + t_{lset} \quad (8)$$

A number of techniques are available for reducing the critical path delay $T_{crit}$ through use of fast addition circuits. One such technique reduces the delay attributable to the first term of Equation (7) by using (N/K)-input AND gates in parallel with (K−2) two-input AND gates. The critical path delay in this case becomes:

$$T_{crit} = \left(\frac{N}{K} + K - 3\right) \cdot t_{and2} + t_{and\frac{N}{K}} + t_{xor2} + t_{lset} \quad (9)$$

where $t_{andN/K}$ is the delay of the (N/K)-input AND gate. Although such techniques do provide some reduction in the critical path delay of a ripple-carry counter, the delay remains unacceptably high for many important high-speed electronic device applications.

It is therefore apparent that a need exists for a synchronous binary counter which provides a substantially lower critical path delay relative to that provided using conventional techniques, without substantially increasing the cost and complexity of the counter circuit.

SUMMARY OF THE INVENTION

An N-bit binary synchronous counter in accordance with the present invention achieves a significant reduction in critical path delay by precomputing terms which are independent of an incoming carry at one or more stages of the counter. The invention provides a critical path delay which is substantially independent of N, and significantly less than that provided using conventional ripple-carry techniques. An illustrative binary synchronous counter in accordance with the invention includes K counter stages, with each stage including N/K flip-flops or other suitable storage elements. A given one of the counter stages receives a carry-in signal generated by another counter stage or a carry logic circuit. The given counter stage includes a selection circuit for selecting one of two precomputed carry-independent values for application to an input of a storage element in that stage, based on a value of the carry-in signal. The selection circuit may include a two-input multiplexer for each of the N/K storage elements of the given counter stage. The jth multiplexer includes a first input coupled to an output of the jth storage element, and a second input coupled to an output of a logic circuit generating a logic function based on the output of the jth storage element. The carry-in signal is applied as a select signal to the multiplexer and is used to select which of the two multiplexer inputs will be applied as a data input to the storage element. The logic function generated by the logic circuit for the jth storage element may be of the form $Q_0 \cdot Q_1 \cdot Q_2 \ldots \cdot Q_{j-1} \oplus Q_j$, where $Q_j$ is the output of the jth storage element and $\oplus$ is the exclusive-or operator. The selection of one of two precomputed values for application to an input of the storage element results in the counter having a critical path delay which is substantially independent of the number of bits N in the binary count generated by the counter. Similar precomputation and selection operations may be provided for each of the K stages of the counter.

The invention substantially reduces critical path delay in a binary synchronous counter. For embodiments in which N is large and K is on the order of the square-root of N, the speed of counter operation can be nearly doubled relative to that of conventional counter implementations. Moreover, these improvements may be provided using only minimal additional counter circuitry. The techniques are applicable to a wide variety of counter configurations, including up counters, down counters and up/down counters. These and other features and advantages of the present invention will become more apparent from the accompanying drawings and the following detailed description.

DETAILED DESCRIPTION OF THE INVENTION

Figure 1:
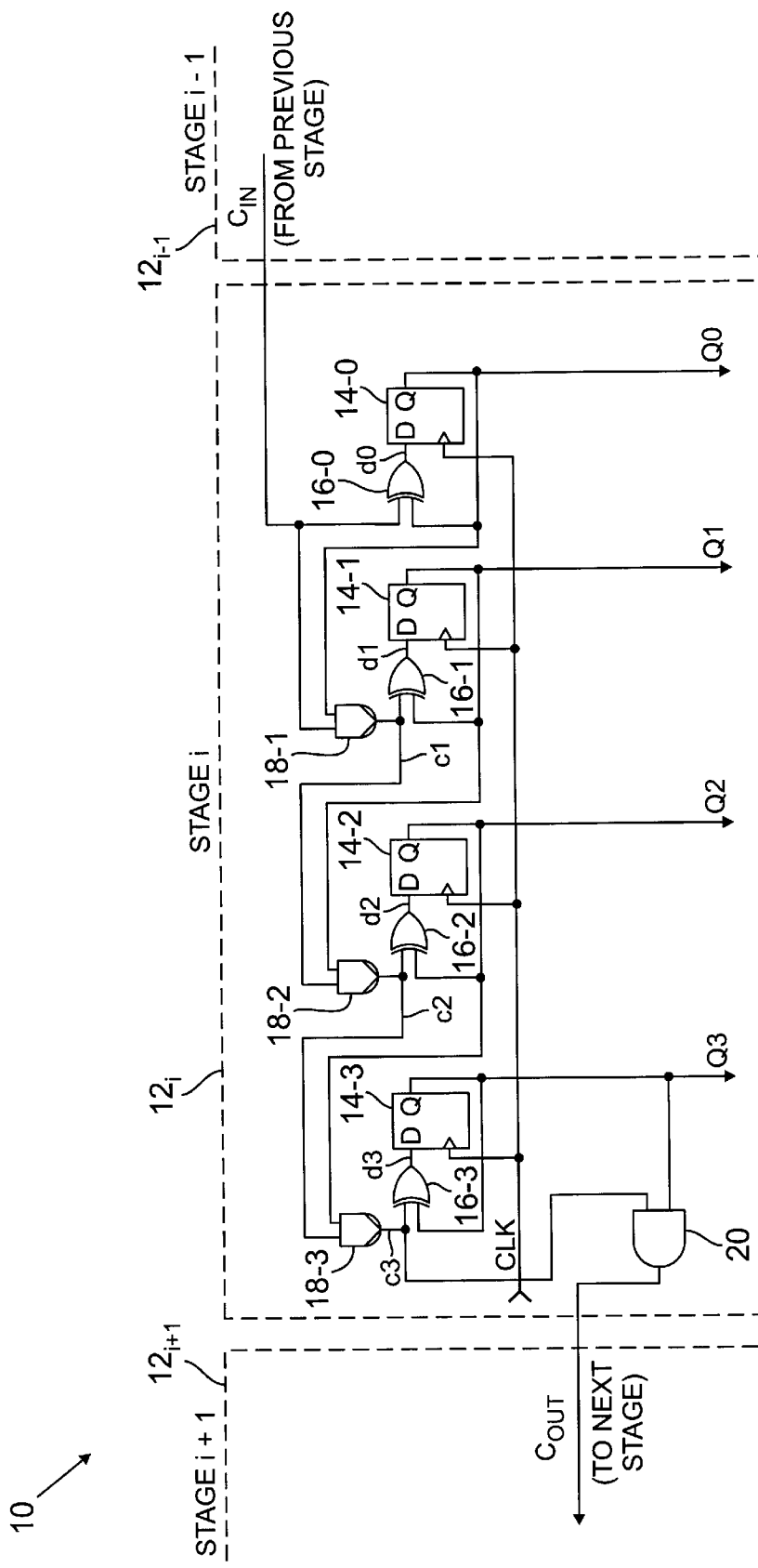
FIG. 1 is a schematic diagram of a binary synchronous ripple-carry counter in accordance with the prior art.

The present invention will be illustrated below in conjunction with exemplary binary synchronous counters. It should be understood, however, that the invention is not limited to use with any particular type of counter, but is instead more generally applicable to any counter in which it is desirable to provide a significant reduction in critical path delay without unduly increasing the cost or complexity of the counter circuit. For example, although illustrated using exemplary "up" counters, it will be apparent to those skilled in the art that the disclosed techniques are readily applicable to "down" counters and up/down counters. The term "precomputed" as used herein refers generally to computation in a given counter stage which takes place before arrival of a particular portion of a carry-in signal used to trigger certain counter operations in the given counter stage. A "term" or "value" which is precomputed is intended to include any internal signal of a counter stage, such as a particular data signal input of a flip-flop in a given counter stage. The carry-in signal supplied to a given counter stage may be generated by another counter stage or by a carry logic circuit.

The present invention reduces critical path delay in a binary synchronous counter by precomputing terms which are independent of incoming carry at each stage of the counter. The invention achieves a critical path delay which is substantially independent of N, and significantly less than that achievable using conventional ripple-carry techniques. Moreover, these improvements may be provided using only minimal additional counter circuitry. The invention is based on the recognition that critical path delay reduction can be achieved in a synchronous counter such as the conventional counter 10 of FIG. 1 by utilizing precomputation of certain carry-independent terms. For example, the signals $c_3$ and $d_3$ in stage 12$_i$ of the conventional counter 10 may be expressed as a function of $C_{IN}$ as follows:

$$c_3 = c_2 \cdot Q_2 = c_1 \cdot Q_1 Q_2 = C_{IN} Q_0 \cdot Q_1 \cdot Q_2 \qquad (10)$$

$$d_3 = c_3 \oplus Q_3 = C_{IN} \cdot (Q_0 \cdot Q_1 \cdot Q_2) \oplus Q_3 \qquad (11)$$

where $\oplus$ is the exclusive-or operator. Equation (11) may be rewritten as:

$$d_3 = Q_3 \text{ if } C_{IN} = 0 \qquad (12)$$

$$d_3 = (Q_0 \cdot Q_1 \cdot Q_2) \oplus Q^3 \text{ if } C_{IN} = 1 \qquad (13)$$

More generally, for an N/K-bit counter stage of an N-bit counter, the input $d_j$ to the $j^{th}$ flip-flop is given by:

$$d_j = Q_j \text{ if } C_{IN} = 0, j = 1, 2, \ldots N/K \qquad (14)$$

$$d_j = (Q_0 \cdot Q_1 \cdot \ldots \cdot Q_{j-1}) \oplus Q_j \text{ if } C_{IN} = 1, j = 1, 2, \ldots N/K \qquad (15)$$

For the case of j=0, the input $d_0$ may be written as:

$$d_0 = Q_0 \text{ if } C_{IN} = 0 \qquad (16)$$

$$d_0 = \overline{Q}_0 \text{ if } C_{IN} = 1 \qquad (17)$$

Since the $Q_j$ values are generally available relatively early with respect to the carry-in signal $C_{IN}$, it is apparent from Equations (14) and (15) that the two possible values for $d_j$ could be precomputed, and a particular one of the two precomputed values could then be selected upon receipt of the carry-in signal $C_{IN}$ based on the actual value of $C_{IN}$. The possible $d_j$ values thus represent carry-independent terms which may be precomputed at each stage of a binary counter using the techniques of the invention.

Figure 2:
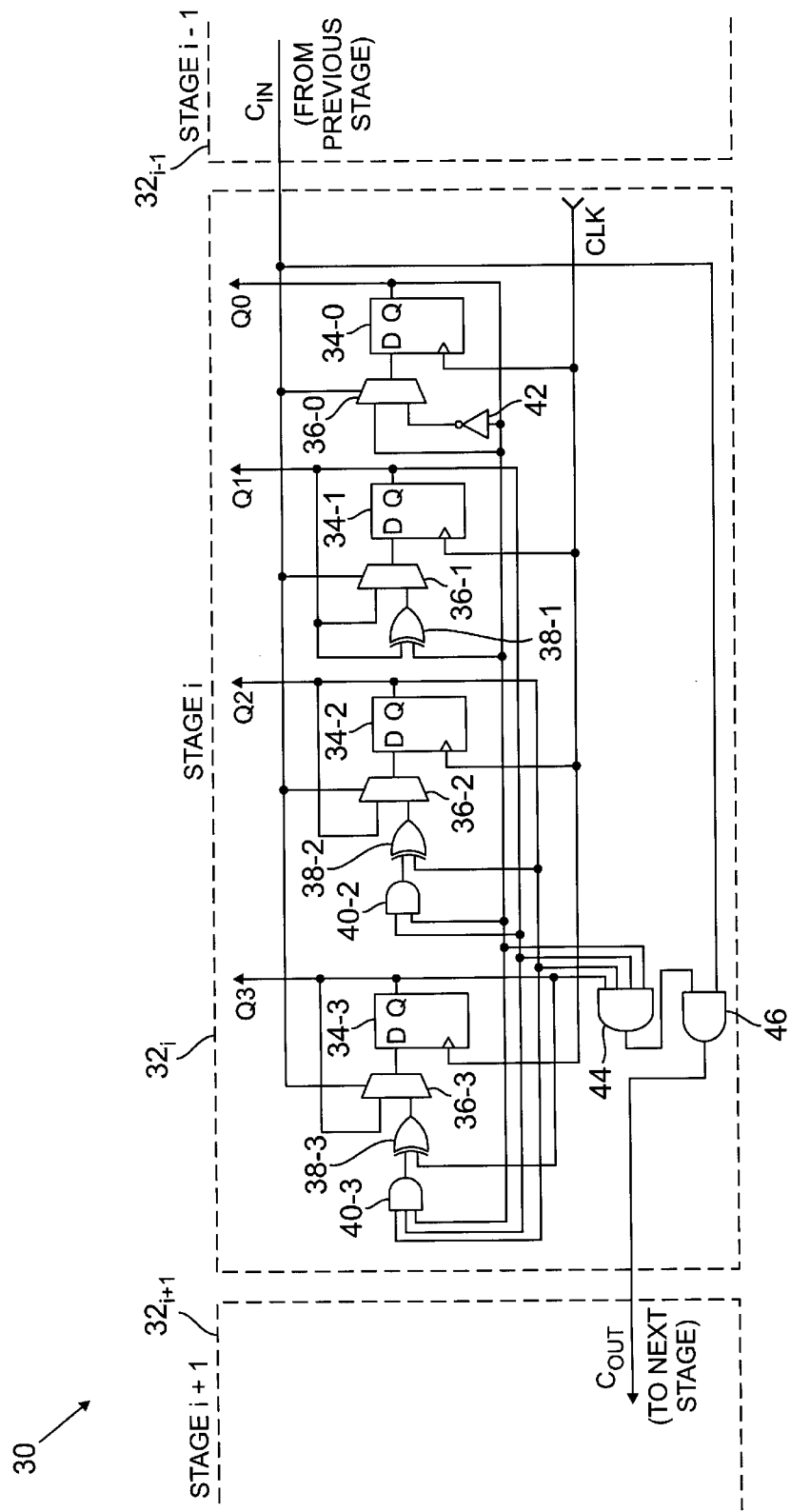
FIG. 2 is a schematic diagram of a binary synchronous counter in accordance with a first illustrative embodiment of the present invention.

FIG. 2 shows a portion of a binary synchronous counter 30 incorporating the above-described precomputation in accordance with an illustrative embodiment of the present invention. The counter 30 is an N-bit counter divided into K stages, with each stage storing N/K bits of a binary count.

The counter 30 may be an element of a microprocessor, digital signal processor, or another integrated circuit or electronic device. FIG. 2 includes a detailed view of an single exemplary stage $32_i$ of the K-stage counter 30, and also illustrates the interconnection of stage $32_i$ with a previous stage $32_{i-1}$ and a subsequent stage $32_{i+1}$ of the counter 30. The stage $32_i$ receives a carry-in signal $C_{IN}$ from the previous stage $32_{i-1}$, and delivers a carry-out signal $C_{OUT}$ to the subsequent stage $32_{i+1}$. The stage $32_i$ includes four D-type flip-flops 34-0, 34-1, 34-2 and 34-3 arranged as shown. The data signal inputs of the four flip-flops will be referred to as $d_0$, $d_1$, $d_2$ and $d_3$. The uncomplemented or Q outputs of the flip-flops 34-0, 34-1, 34-2 and 34-3 provide the $Q_0$, $Q_1$, $Q_2$ and $Q_3$ outputs, respectively, of counter stage $32_i$. Each of the flip-flops 34-0, 34-1, 34-2 and 34-3 is clocked by a common clocked by a common clock signal CLK.

The $d_0$, $d_1$, $d_2$ and $d_3$ data inputs of the respective flip-flops 34-0, 34-1, 34-2 and 34-3 correspond to outputs of respective two-input multiplexers 36-0, 36-1, 36-2 and 36-3. The carry-in signal $C_{IN}$ from the previous stage $32_{i-1}$ is coupled to a select signal input of each of the two-input multiplexers. As will be described in greater detail below, each of the two-input multiplexers 36-j is used to select a particular precomputed value of $d_j$ for application to the data input of the corresponding flip-flop 34-j, based on the value of the carry-in signal $C_{IN}$. A first input of each of the multiplexers 36-0, 36-1, 36-2 and 36-3 is driven by an uncomplemented output of a corresponding one of the respective flip-flops 34-0, 34-1, 34-2 and 34-3. The first multiplexer input thus corresponds to the precomputed value of $d_j$ specified in Equation (14) above. This precomputed value is supplied by multiplexer 36-j to the data input of the flip-flop 34-j if the $C_{IN}$ signal has a value of logic 0.

The second inputs of the multiplexers 36-1, 36-2 and 36-3 are each driven by an output of two-input XOR gates 38-1, 38-2 and 38-3, respectively. The first XOR gate 38-1 receives as inputs the uncomplemented outputs $Q_0$ and $Q_1$ of the flip-flops 34-0 and 34-1. The second XOR gate 38-2 receives as a first input the uncomplemented output $Q_2$ of the flip-flop 34-2, and as a second input the output of a two-input AND gate 40-2. The AND gate 40-2 receives as inputs the uncomplemented outputs $Q_0$ and $Q_1$ of the flip-flops 34-0 and 34-1, respectively. The third XOR gate 38-3 receives as a first input an uncomplemented output $Q_3$ of the flip-flop 34-3, and as a second input the output of a three-input AND gate 40-3. The AND gate 40-3 receives as inputs the uncomplemented outputs $Q_0$, $Q_1$ and $Q_2$ of the flip-flops 34-0, 34-1 and 34-2, respectively. The second input of the multiplexer 36-0 is driven by the output of an inverter 42 which inverts the output $Q_0$ of flip-flop 34-0. The second input of each of the multiplexers 36-0, 36-1 36-2 and 36-3 thus corresponds to the second precomputed value of $d_j$ specified in Equation (15) above. This precomputed value is supplied by a given multiplexer 36-j to the data input of the corresponding flip-flop 34-j if $C_{IN}$ has a value of logic 1. A carry-out signal $C_{OUT}$ is generated by counter stage $32_i$ using four-input AND gate 44 and two-input AND gate 46 as shown. This carry-out signal is supplied to the next stage $32_{i+1}$ of the counter 30.

The two-input multiplexers 36-0, 36-1, 36-2 and 36-3 thus each serve to select one of two possible precomputed values of the corresponding data inputs $d_0$, $d_1$, $d_2$ and $d_3$. The $C_{IN}$ signal is thus used as a select signal in a given multiplexer 36-j to select which of the two possible precomputed values of $d_j$ will be supplied to the data input of the corresponding flip-flop 34-j. Similar carry-independent precomputation may be used in stages $32_{i-1}$ and $32_{i+1}$ as well as all other stages of the counter 30, or a subset of the stages of the counter 30. It will be demonstrated below that precomputing the two possible carry-independent values of each $d_j$, and then selecting one of the two precomputed values for each $d_j$ using the corresponding two-input multiplexer 36-j, substantially reduces the critical path delay in the counter 30.

As in a conventional binary synchronous counter, the carry-in signal $C_{IN}$ from counter stage $32_{i-1}$ is delayed with respect to the clock signal CLK because of gate delays in stage $32_{i-1}$ and earlier stages. It can be seen from FIG. 2 that the above-described precomputation in accordance with the invention considerably reduces the critical path delay for latching the MSB in stage $32_i$. If $C_{IN}$ is assumed to arrive in stage $32_i$ at time $t_{cin}$, the critical path delay $t_{Qcrit}$ for latching the MSB $Q_3$ in counter stage $32_i$ may be written as:

$$t_{Qcrit} = t_{cin} + t_{mux2} + t_{lset} \qquad (18)$$

where $t_{mux2}$ is the delay of a two-input multiplexer 36-j, and $t_{lset}$ is the latch settling delay of the D-type flip-flops 34-j. Similarly, the delay $t_{Ccrit}$ for the carry-out signal $C_{OUT}$ can be given by:

$$t_{Ccrit} = t_{cin} + t_{and2} \qquad (19)$$

Thus, the total critical path delay $T_{crit}$ in the counter stage $32_i$ is given by:

$$T_{crit} = (K-2) \cdot t_{Ccrit} + t_{Qcrit} + t_{0crit} \qquad (20)$$

where $t_{0crit}$ is the carry-out delay of the first counter stage. Since the first counter stage does not have any carry signal coming in, $t_{0crit}$ is simply the delay of an N/K-input AND gate, where N/K=4 in this illustrative embodiment:

$$t_{0crit} = t_{and4} \qquad (21)$$

Using Equations (18), (19), (20) and (21), the critical path delay $T_{crit}$ may be written as:

$$T_{crit} = (K-2) \cdot t_{and2} + t_{and\frac{N}{K}} + t_{mux2} + t_{lset} \qquad (22)$$

which represents a substantial improvement in critical path delay over the conventional implementation described in conjunction with FIG. 1 above. More particularly, the $T_{crit}$ of counter 30 is reduced by a factor of:

$$\left(\frac{N}{K} - 1\right) \cdot t_{and2} \qquad (23)$$

relative to that of the prior art implementation described in conjunction with Equation (9) above, and by a factor of:

$$(N-K) \cdot t_{and2} \qquad (24)$$

over a standard ripple-carry adder, assuming that a two-input multiplexer has a delay less than or equal to that of a two-input XOR gate. Moreover, it is apparent from Equation (22) above that the value of $T_{crit}$ in the inventive counter 30 is substantially independent of N because the delay of an N/K-input AND gate is only weakly dependent on N. For embodiments in which N is large and K is on the order of the square-root of N, the speed of counter operation can be nearly doubled relative to conventional implementations.

Figure 3:
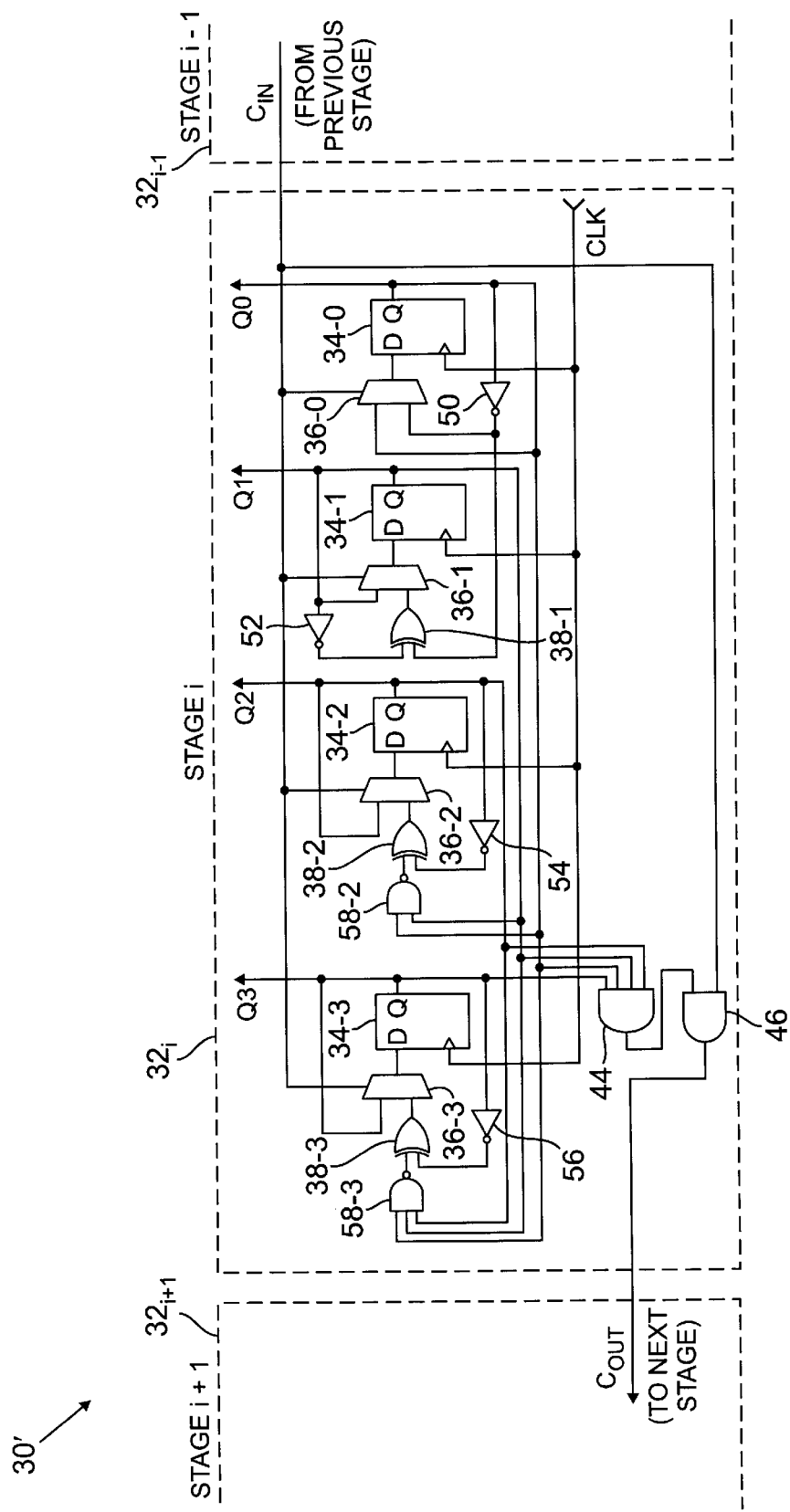
FIG. 3 is a schematic diagram of a binary synchronous counter in accordance with a second illustrative embodiment of the present invention.

FIG. 3 shows another illustrative binary counter 30' in accordance with the invention. The counter 30' operates in a manner similar to that of the counter 30 of FIG. 2 in terms of reduction of critical path delay, but provides further performance improvements. In the counter 30 of FIG. 3, the reduction of critical path delay resulted in an increase in the load driven by the flip-flop outputs. For example, output $Q_0$ of flip-flop 34-0, which in a conventional counter such as counter 10 of FIG. 1 drives one XOR gate input and two AND gate inputs, in the FIG. 2 counter drives inverter 42, one input of multiplexer 36-0, one input of XOR gate 38-1, and one input of each of the AND gates 40-2 and 40-3. Although the additional loading on the $Q_1$, $Q_2$ and $Q_3$ outputs is less than that of the $Q_0$ output, the total additional loading may nonetheless present a significant RC delay at higher operating speeds in certain applications. In addition, the use of AND gates in the FIG. 2 counter may require an extra inverter at the gate output, and may therefore add delay in the precomputation of carry-independent terms. The counter 30' of FIG. 3 is configured to address these and other potential drawbacks of the FIG. 2 implementation. The configuration of the logic circuitry in counter 30' makes use of the fact that:

$$Z = A \oplus B = \overline{A} \oplus \overline{B} \tag{25}$$

where A and B are arbitrary Boolean variables. The use of this equivalence allows one input of each of the XOR gates 38-1, 38-2 and 38-3 of FIG. 3 to be driven by a corresponding output of inverters 52, 54 and 56 as shown, rather than directly by the outputs of the flip-flops as in the FIG. 2 embodiment. The other input of XOR gate 38-1 is driven by the output of inverter 50, and the other inputs of XOR gates 38-2 and 38-3 are driven by the outputs of NAND gates 58-2 and 58-3, respectively. The flip-flop outputs therefore no longer need to drive the large input capacitance typically associated with an XOR gate, and the RC delay is substantially reduced. It should be noted that the alternative implementation of FIG. 3 does not alter the critical path delay, and Equation (22) given above remains valid.

Figure 4:
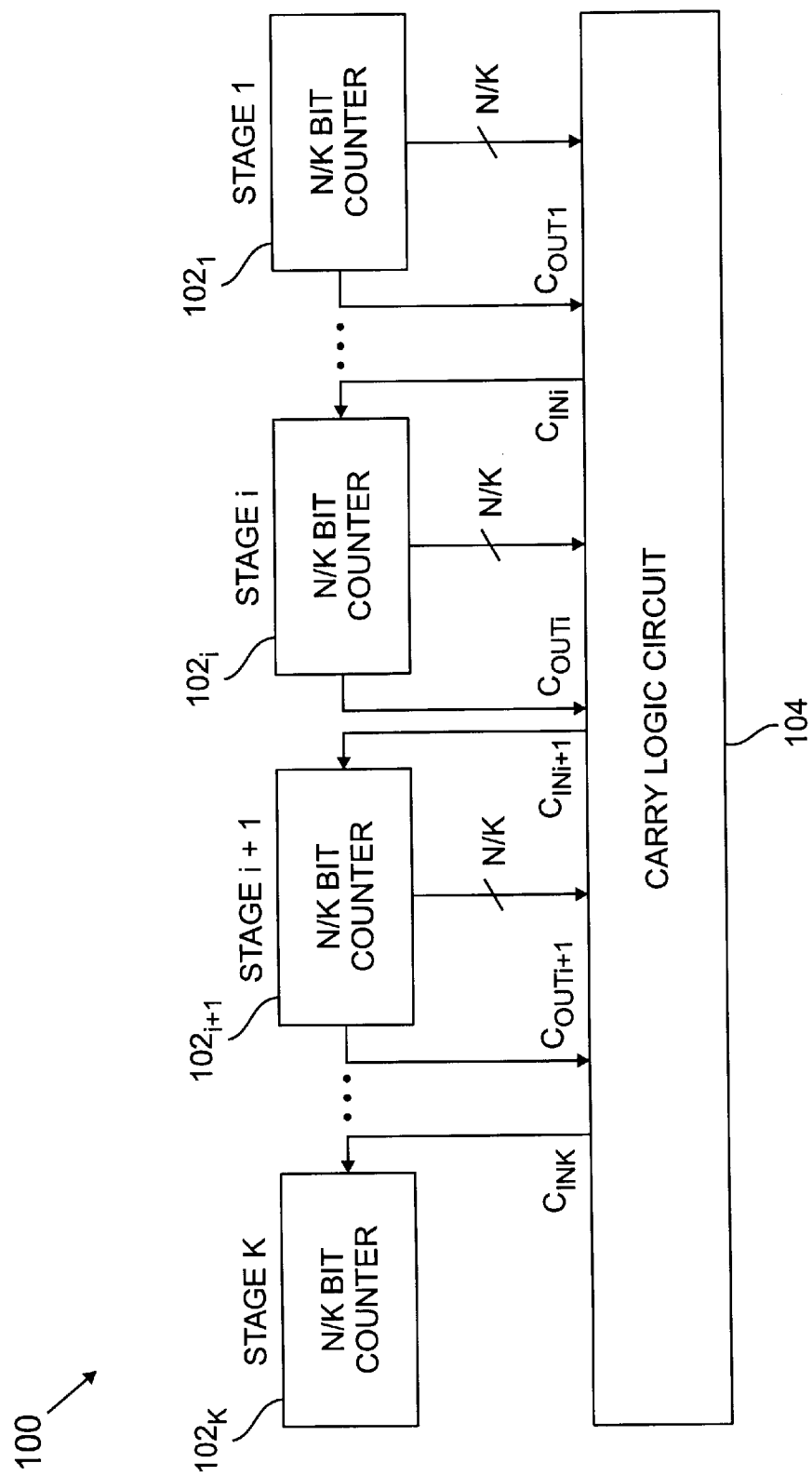
FIG. 4 shows the general structure of an N-bit binary counter in accordance with the invention constructed using K counters of N/K bits each.

FIG. 4 shows an exemplary N-bit binary counter 100 in accordance with the invention, constructed using K counters 102 of N/K bits each. The N-bit counter 100 includes K stages, and stages 1, i, i+1 and K are shown. Stages 1, i, i+1 and K include N/K bit counters $102_1$, $102_i$, $102_{i+1}$ and $102_K$, respectively. The carry-out signals $C_{OUT1}$, $C_{OUT2}$, ... $C_{OUTK-1}$ from the first K-1 stages are supplied as inputs to a carry logic circuit 104. The N/K bit counter outputs from the first K-1 stages are also supplied as inputs to the carry logic circuit 104. The carry logic circuit 104 supplies carry-in signals $C_{IN2}$, $C_{IN3}$, ... $C_{INK}$ to the last K-1 stages of the counter. In general, the carry-in signal $C_{INj}$ for stage i of the counter depends on the carry-out signals $C_{OUT1}$, $C_{OUT2}$, ... $C_{OUTi-1}$ and the counter outputs from stages 1, 2, ... i-1. The counter stages described in conjunction with FIGS. 2 and 3 above may be used to form N-bit counters of the type shown in FIG. 4.

The illustrative embodiments of the present invention described above may be configured to meet the requirements of a variety of different circuit applications, using any desired values of N and K. The invention can be utilized in numerous applications, including microprocessors, memory circuits and telecommunications hardware. Moreover, as previously noted, a variety of other types of counters, including down counters and up/down counters, may also make use of the techniques of the present invention.

The above-described embodiments of the invention are intended to be illustrative only. Numerous alternative embodiments may be devised by those skilled in the art without departing from the scope of the following claims.

What is claimed is:

1. A counter comprising:
    a plurality of counter stages, with at least one of the counter stages receiving a carry-in signal; and
    a selection circuit in the at least one counter stage for selecting one of at least two precomputed values for application to an input of a storage element in that stage based on a value of the carry-in signal, wherein the precomputed values are independent of the carry-in signal.

2. The counter of claim 1 wherein the selection circuit includes a multiplexer having a first input coupled to an output of the storage element, a second input coupled to an output of a logic circuit generating a logic function based on the storage element output, and a select signal input for receiving the carry-in signal.

3. The counter of claim 2 wherein the storage element is a flip-flop, and an output of the multiplexer is connected to a data input of the flip-flop.

4. The counter of claim 2 wherein the at least one counter stage includes a plurality of storage elements, and the logic function generated by the logic circuit for a jth storage element in the plurality of storage elements is of the form $Q_0 \cdot Q_1 \cdot Q_2 \cdot \ldots \cdot Q_{j-1} \oplus Q_j$, where $Q_j$ is the output of the jth storage element and $\oplus$ is the exclusive-or operator.

5. The counter of claim 1 wherein the plurality of stages includes K stages, each including N/K storage elements, where N is the number of bits of a binary count generated by the counter.

6. The counter of claim 5 wherein the selection circuit includes a plurality of multiplexers, one for each of the N/K storage elements, with each multiplexer having a first input coupled to an output of its corresponding storage element, a second input coupled to an output of a logic gate generating a logic function based on the storage element output, and a select signal input for receiving the carry-in signal.

7. The counter of claim 1 wherein the selection of one of the precomputed values for application to an input of the storage element results in the counter having a critical path delay which is substantially independent of a number N of bits in a binary count generated by the counter.

8. A method of operating an electronic counter comprising the steps of:
    configuring the counter to include a plurality of counter stages, with at least one of the counter stages receiving a carry-in signal; and
    selecting one of at least two precomputed values for application to an input of a storage element in the at least one counter stage based on a value of the carry-in signal, wherein the precomputed values are independent of the carry-in signal.

9. The method of claim 8 wherein the selecting step includes using the value of the carry-in signal to select whether to apply a first signal corresponding to an output of the storage element, or a second signal corresponding to a logic function based on the storage element output, to an input of the storage element.

10. The method of claim 9 wherein the storage element is a flip-flop, and the selected first or second signal is applied to a data input of the flip-flop.

11. The method of claim 9 wherein the at least one counter stage includes a plurality of storage elements, and the logic function generated by the logic circuit for a jth storage element in the plurality of storage elements is of the form $Q_0 \cdot Q_1 \cdot Q_2 \ldots \cdot Q_{j-1} \oplus Q_j$, where $Q_j$ is the output of the jth storage element and $\oplus$ is the exclusive-or operator.

12. The method of claim 8 wherein the plurality of stages includes K stages, each including N/K storage elements, where N is the number of bits of a binary count generated by the counter.

13. The method of claim 12 wherein the selecting step includes, for each of the N/K storage elements, using the value of the carry-in signal to select whether to apply a first signal corresponding to an output of a given storage elements, or a second signal corresponding to a logic function based on the output of the given storage element, to an input of the given storage element.

14. The method of claim 8 wherein the selecting step provides the counter with a critical path delay which is substantially independent of a number N of bits in a binary count generated by the counter.

15. An integrated circuit comprising:

a plurality of counter stages, with at least one of the counter stages receiving a carry-in signal, the counter including a selection circuit in the at least one counter stage for selecting one of at least two precomputed values for application to an input of a storage element in that stage based on a value of the carry-in signal, wherein the precomputed values are independent of the carry-in signal from the other stage of the counter; and a carry logic circuit for generating the carry-in signal for the at least one stage.

16. The integrated circuit of claim 15 wherein the selection circuit includes a multiplexer having a first input coupled to an output of the storage element, a second input coupled to an output of a logic circuit generating a logic function based on the storage element output, and a select signal input for receiving the carry-in signal generated by the other counter stage.

17. The integrated circuit of claim 16 wherein the at least one counter stage includes a plurality of storage elements, and the logic function generated by the logic circuit for a jth storage element in the plurality of storage elements is of the form $Q_0 \cdot Q_1 \cdot Q_2 \ldots \cdot Q_{j-1} \oplus Q_j$, where $Q_j$ is the output of the jth storage element and $\oplus$ is the exclusive-or operator.

18. The integrated circuit of claim 15 wherein the selection of one of the precomputed values for application to an input of the storage element results in the counter having a critical path delay which is substantially independent of a number N of bits in a binary count generated by the counter.

19. The integrated circuit of claim 15 wherein the plurality of stages includes K counter stages of N/K bits each, and wherein carry-out signals $C_{OUT1}, C_{OUT2}, \ldots C_{OUTK-1}$ from the first K−1 counter stages are supplied as inputs to the carry logic circuit.

20. The integrated circuit of claim 19 wherein the carry logic circuit utilizes the carry-out signals $C_{OUT1}, C_{OUT2}, \ldots C_{OUTK-1}$ from the first K−1 stages, along with the counter outputs of the first K−1 stages, to generate carry-in signals $C_{IN2}, C_{IN3}, \ldots C_{INK}$ for the last K−1 stages.

* * * * *